United States Patent
Pass

[19]

[11] Patent Number: 5,376,899
[45] Date of Patent: Dec. 27, 1994

[54] AMPLIFIER WITH GAIN STAGES COUPLED FOR DIFFERENTIAL ERROR CORRECTION

[75] Inventor: Nelson S. Pass, Foresthill, Calif.

[73] Assignee: Pass Laboratories, Inc., Foresthill, Calif.

[21] Appl. No.: 192,173

[22] Filed: Feb. 4, 1994

[51] Int. Cl.$^5$ .............................. H03F 3/45
[52] U.S. Cl. ..................... 330/253; 330/69
[58] Field of Search ........... 330/69, 253, 255, 264, 330/277, 124 R

[56] References Cited

U.S. PATENT DOCUMENTS

| | | | |
|---|---|---|---|
| 3,970,953 | 7/1976 | Walker et al. | 330/99 |
| 4,107,619 | 8/1978 | Pass | 330/255 |
| 4,797,631 | 1/1989 | Hsu et al. | 330/253 |
| 4,888,559 | 1/1989 | Sevenhans et al. | 330/253 |
| 5,227,735 | 7/1993 | Lumsden | 330/124 R X |

Primary Examiner—Steven Mottola
Attorney, Agent, or Firm—Schneck & McHugh

[57] ABSTRACT

An amplifier circuit having two identical inverting folded-cascode amplifier stages coupled together through a coupling resistor at the positive terminals of the respective stages. Each stage includes an input gain transistor whose gate forms the negative input terminal of the amplifier stage coupled to receive an input signal through an input resistor, whose source forms the positive input terminal of the amplifier stage, and whose drain is connected to the source of a level-shifting cascode transistor. Both transistors are supplied current from a constant current source also connected to the source of the level-shifting transistor. The drain of the level-shifting transistor forms an output terminal of the amplifier stage. Each stage feeds its amplifier output negatively to the positive input of the other stage, while at the same time feeding its distortion and noise contribution positively, via input gain transistor conduction, to the other stage. Balanced amplified outputs are produced from either balanced or unbalanced inputs, and distortion and noise components are produced in common on both outputs for differential cancellation. Complementary-symmetry and power amplifier versions of the basic single-ended line-level amplifier are also provided.

13 Claims, 7 Drawing Sheets

AMPLIFIER WITH GAIN STAGES COUPLED FOR DIFFERENTIAL ERROR CORRECTION

TECHNICAL FIELD

The present invention relates to semiconductor linear amplifiers, especially high fidelity audio amplifiers, producing a balanced differential output signal from a balanced or unbalanced differential input signal, and in particular relates to feedback and coupling arrangements for reducing distortion and noise in the amplifier output signal.

BACKGROUND ART

Balanced line signals are pairs of analog signals of equal amplitude (approx. one volt maximum) but of opposite polarity, which are transmitted through cables and received by circuitry that amplifies the difference between the two signals. Any common mode components in the signal pair, which may be obtained both from radiated noise picked up by the cable and from hum due to ground loops between interconnected elements of the system, are cancelled out and rejected by the receiving differential amplifier circuitry, producing an amplified output lacking most of the common input noise. Thus, balanced line circuits are better able to discriminate signal from noise, resulting in improved transmission quality.

Amplifiers for use with balanced lines should be able to amplify two input signals of opposing polarity, i.e. balanced input signals, and produce balanced outputs. In addition, such amplifiers should be able to create balanced output signals from an unbalanced signal source, where needed, such as at the transmitting end of balanced lines in some systems. These amplifiers should not only reject as much of the common mode component in the input signals as possible, but should also contribute as little of their own distortion or noise as possible to the balanced outputs.

Figure 5:
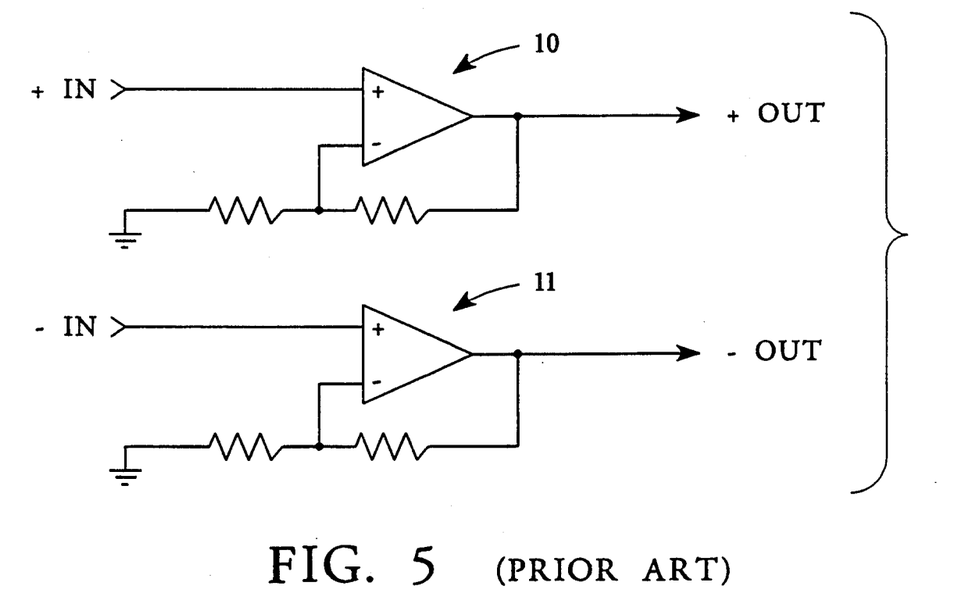
FIG. 5 is a functional circuit diagram of a first prior art differential amplifier.

Examples of several differential amplifiers of the prior art are illustrated in FIGS. 5–8. FIG. 5 shows independent amplification of balanced input signals +IN and −IN by two separate gain stages 10 and 11. Although this circuit produces balanced output signals +OUT and −OUT when the input signals are balanced, it will not produce a balanced output from an unbalanced source. Also, each gain stage amplifies not only the desired signal, but also amplifies the incoming noise. Not only do the independent gain stages not remove common mode noise components from the incoming signal, but they also add their own distortion and noise to the outputs.

Figure 6:
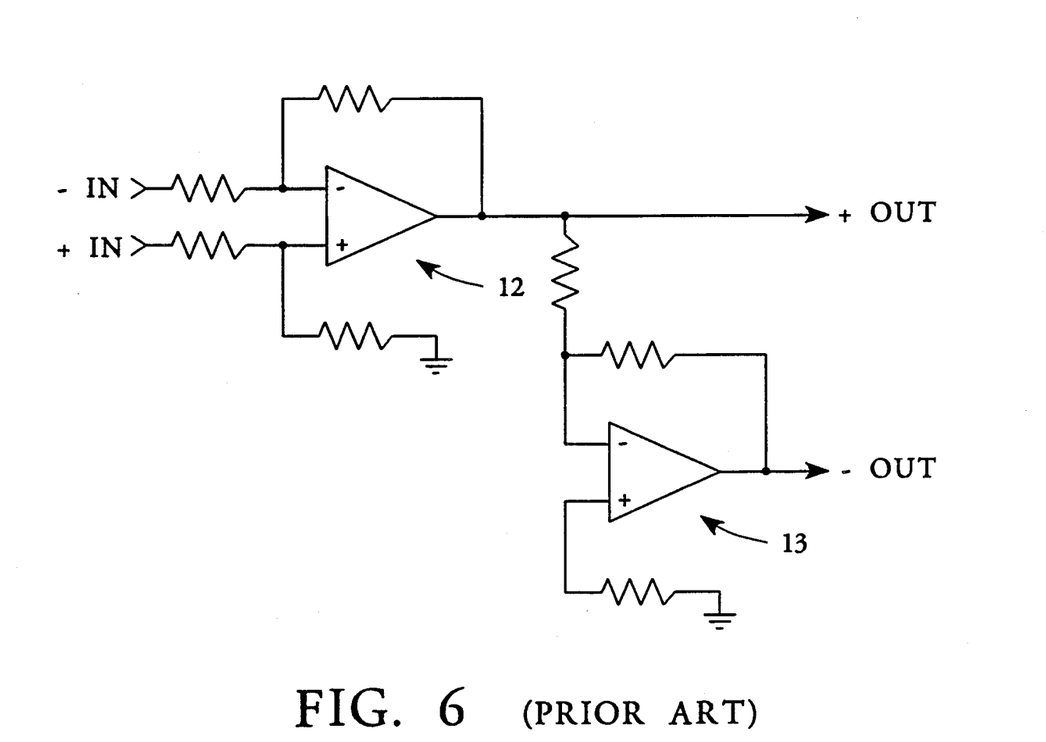
FIG. 6 is a functional circuit diagram of a second prior art differential amplifier.

FIG. 6 shows a differential amplifier stage 12 with an inverting amplifier 13 attached to its output. The differential amplifier accepts either balanced or unbalanced inputs +IN and −IN and amplifies the differential signal while rejecting the common mode noise. The output +OUT of this stage, while lacking most of the input noise, will now carry the distortion and noise contributed by the amplifier stage 12. The inverting amplifier 13, preferably of negative unity gain, provides an output signal −OUT of opposite polarity from the first output +OUT. The distortion and noise of the first output +OUT is carried through inverted to the second output −OUT and additional distortion and noise is contributed by the inverting amplifier 13.

Figure 7:
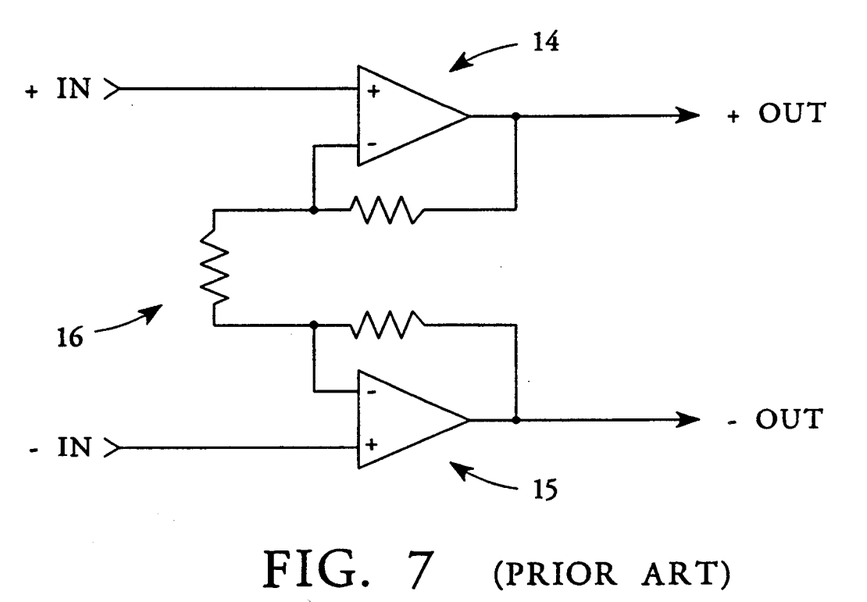
FIG. 7 is a functional circuit diagram of a third prior art differential amplifier.

FIG. 7 shows two gain stages 14 and 15 coupled together by a resistor 16 across their respective negative feedback terminals. The amplifier accepts both balanced and unbalanced inputs and produces a balanced output. It does not reject the common mode signal, but neither does it amplify it. The distortion and noise contributions of both amplifiers will show in both outputs with opposite polarity so that they will not be removed differentially at the load.

Figure 8:
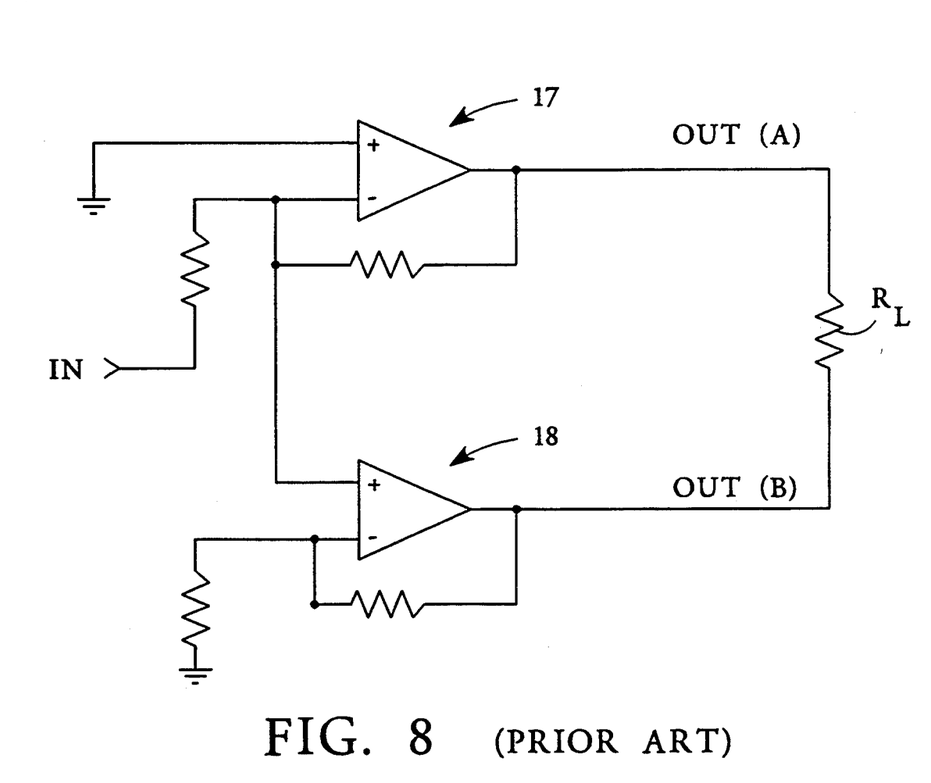
FIG. 8 is a functional circuit diagram of a fourth prior art differential amplifier.

FIG. 8 shows a first amplifier 17 amplifying an input signal IN and providing an output signal OUT(A) that includes the input noise amplified plus the distortion and noise added by the amplifier 17 itself. The negative feedback junction of the amplifier 17 is held at ground potential plus the amplifier contributed error at the output divided by the loop gain. At this location we see the errors of the amplifier 17 separated from the input signal. A second amplifier 18 amplifies this error and passes it along on the balanced line OUT(B) in common with the original error on the output line OUT(A). The distortion and noise contributed by the first amplifier is thus removed at the load $R_L$ by common mode rejection. However, there is no correction for any distortion and noise contributed to the balanced line OUT(B) by the second amplifier 18. The noise from the second amplifier 18 will be comparable to the noise from the first amplifier 17, and thus an improvement is only obtained if the distortion by the second amplifier 18 is less than that of the first amplifier 17. This reduces the performance of the two amplifiers operating in tandem to mostly that of the second amplifier. Fortunately, the second amplifier 18 operates under more ideal conditions than the first amplifier 16, since it only needs to swing the voltage of the first amplifier's distortion and noise contribution and not the much larger voltage of the input signal IN. Accordingly, it can often be made of very high quality, i.e. with very low distortion. For power amplification applications, in which the second amplifier 18 needs to be able to sink the high current through the load $R_L$, it can be biased in class A mode to reduce distortion caused by this sinking of current. Other error correction techniques similarly reduce the performance of an amplifier system to that of an amplifier stage operating under more ideal conditions than another. U.S. Pat. Nos. 3,970,953 to Walker and 4,107,619 to Pass show two examples of such amplifiers.

An object of the invention is to provide a high fidelity amplifier that accepts both balanced and unbalanced input signals, amplifies the input signal with as little added distortion and noise as possible, rejects common mode noise components of the input signal, and produces a balanced differential output signal.

DISCLOSURE OF THE INVENTION

The above object is met by an amplifier circuit having two identical inverting amplifier stages that are coupled together in such a way that the amplified signal output from one stage is fed negatively to the other stage so as to be reinforced differentially at the output of this other stage, while distortion and noise contributions by an amplifier stage to its output are fed positively to the other stage so as to be recreated in common mode at the output of this other stage. Thus the input signal is amplified and provided on balanced differential outputs with the common mode component unamplified, while any amplification errors contributed by the amplifier stages appear in common on both outputs and thus are differentially cancelled.

In particular, each amplifier stage is basically an inverting folded-cascode amplifier with an input gain transistor whose gate forms the negative input and whose source forms the low impedance positive input of the amplifier stage. Each stage also has a cascode (common-gate) level-shifting transistor whose source is connected both to the drain terminal of the input gain transistor and a constant current source which provides bias, and whose drain forms an output of the amplifier.

This simple inverting amplifier stage obtains negative feedback by connecting a resistor from the output (the drain of the cascode transistor) back to the gate of the input transistor. Ordinarily the positive input of such a circuit would be grounded or otherwise connected to ground through a resistor.

By connecting two such amplifier stages together through a resistor between the sources (low impedance positive inputs) of the input transistors, we form a cross coupled balanced amplifier with the characteristic that each complementary half of the amplifier will amplify desired signal in a manner that reinforces the differential output, but will amplify the noise and distortion created by the other half so as to cancel differentially at the output.

The connection between the sources of the input transistors allows a current flow between the two halves of the amplifier, where the phase of the errors and noise of each half appear in reverse phase of the signal. Each amplifier reinforces the signal carried by the other half while reproducing errors in-phase at the output, differentially delivering lower noise and distortion at the output than is found by considering just the output of each amplifier stage.

Both complementary-symmetry and power amplifier versions of this basic single-ended line-level amplifier are provided.

BEST MODE OF CARRYING OUT THE INVENTION

Figure 1:
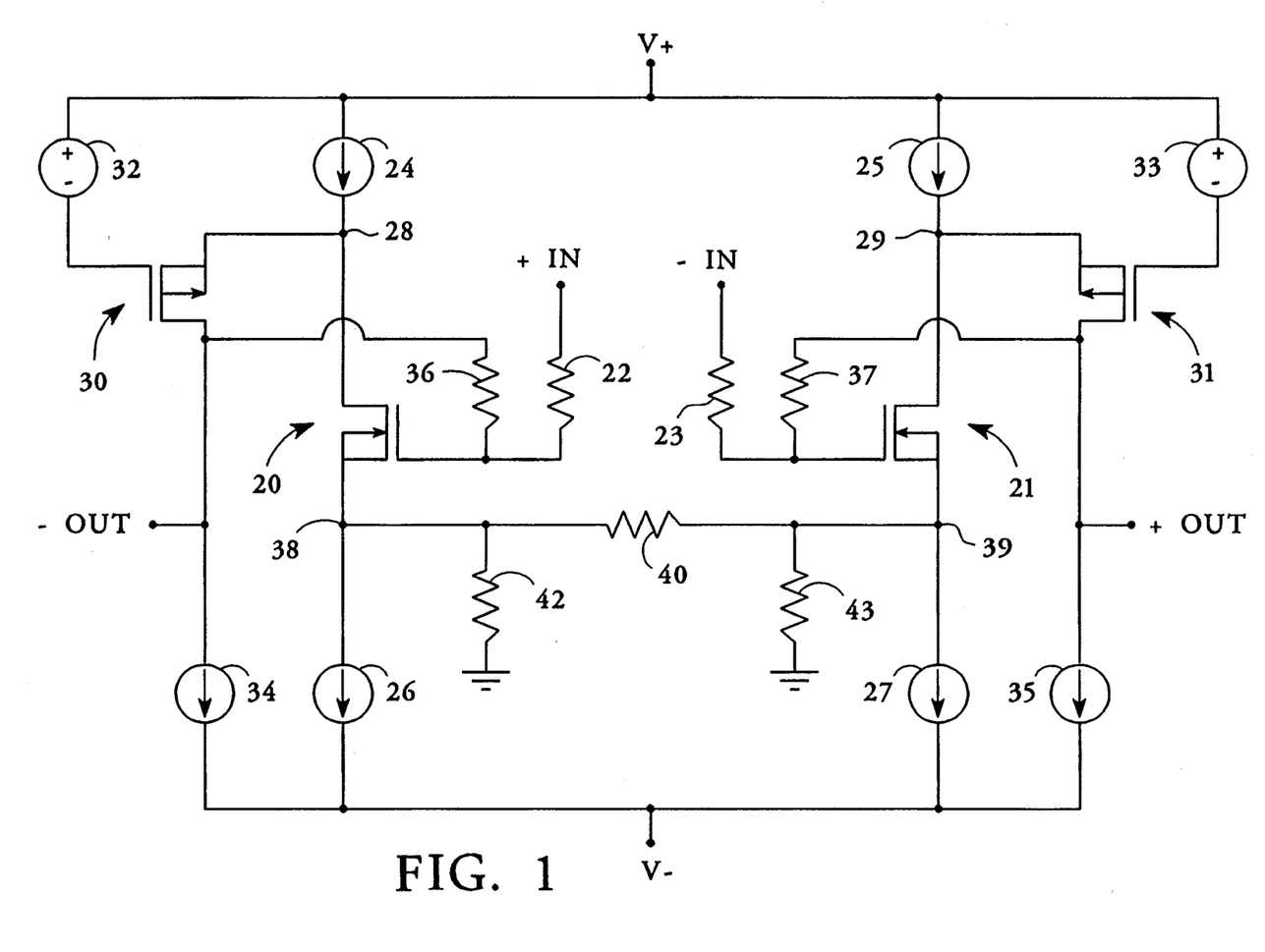
FIG. 1 is a schematic circuit diagram of a first embodiment of an amplifier of the present invention comprising two single-ended inverting folded-cascode amplifier stages coupled together at their input transistor sources.

With reference to FIG. 1, a first amplifier embodiment of the present invention for use as a balanced, line-level (approx. one volt maximum) amplifier comprises two coupled identical amplifier stages. N-channel field-effect transistors 20 and 21 form the input gain devices for the respective amplifier stages. Differential input signals +IN and −IN, preferably balanced, are applied to the gates of transistors 20 and 21 through input resistors 22 and 23, respectively. Transistors 20 and 21 are biased by constant current sources 24-27, which connect the transistors' drain and source terminals to respective balanced positive and negative voltage supplies V+ and V−.

The drains of the gain transistors 20 and 21 form outputs 28 and 29 that connect to the sources of p-channel field-effect transistors 30 and 31. Transistors 30 and 31 form level-shifting devices for the respective amplifier stages of the amplifier circuit. Transistors 30 and 31 are biased by constant current sources 24 and 25, which supply current via the gain transistor outputs 28 and 29 to the source terminals of level-shifting transistor 30 and 31, and by voltage sources 32 and 33, which apply a bias voltage to the gates of transistors 30 and 31 chosen to maintain the transistors 30 and 31 in a conductive state. The drain terminals of level-shifting transistors 30 and 31 form outputs of the amplifier circuit, providing respective output signals −OUT and +OUT. These amplifier outputs are biased by constant current sources 34 and 35 connecting the drains of transistors 30 and 31 to the negative voltage supply V−. Current sources 24 and 25, which bias the level-shifting transistors 30 and 31, provide a constant current that is chosen to equal the sum of the currents supplied by the respective pairs of current sources 26 and 34, and 27 and 35. The voltage drop across the current sources 24 and 25 (typically about 2 volts) determines the voltage bias needed by voltage sources 32 and 33 (typically about 5 ½volts) to maintain transistors 30 and 31 in a conductive state. (This typically requires about a 3-½ volt gate-to-source voltage.)

Feedback is brought back from the outputs of the two coupled amplifier stages through resistors 36 and 37 to the gates of the input transistors 20 and 21, forming a loop system whose negative gain is equal to the ratios of the resistance of feedback resistors 36 and 37 to the resistance of input resistors 22 and 23.

The two coupled amplifier stages are identical, with matching resistances, transistor characteristics and biases, so that the symmetry of the coupled amplifier circuit causes the two stages to act upon one another in an identical manner. Coupling of the two stages is through a resistor 40 connecting the source terminals 38 and 39 of the respective gain transistors 20 and 21.

Basically, the amplifier circuit consists of two identical inverting amplifier stages with their positive inputs 38 and 39 coupled to each other. In the implementation shown in FIG. 1, the amplifier stages are inverting folded-cascode amplifiers. These have an input gain transistor 20 or 21, whose gate forms the negative input of the amplifier and whose source forms a low impedance positive input of the amplifier, and have a nongain level-shifting transistor 30 or 31 operated in a common-gate mode. A constant current source 24 or 25 at the drain of the gain transistor 20 or 21 provides output current to the source terminal of the level-shifting transistor 30 or 31, rather than at its gate, so that the current output of the gain transistor can go directly to the output of the amplifier. An advantage of this implementation is that the level-shifting transistor does not contribute appreciably to the gain-bandwidth performance of the circuit. Further, the phase shift of the amplifier stage is kept to a minimum, allowing stable feedback operation, via resistors 36 and 37, even at high speeds. The low impedance of the positive inputs 38 and 39 of the amplifier stages provides coupling of the two amplifier stages.

In operation, the two coupled amplifier stages both accept differential input signals +IN and −IN, which they each amplify negatively to their respective outputs −OUT and +OUT. The feedback loops back through resistors 36 and 37 to the control gates of the input transistors 20 and 21. To the extent that the amplification is flawless, i.e. without distortion or error, so that the output signals −OUT and +OUT are a linear function of the input signals +IN and −IN, the gates of transistors 20 and 21 remain at ground potential. Only when distortion and noise are added by the amplifier stages do the transistor gates deviate from ground potential, increasing or decreasing the conductance of the input transistors 20 and 21 accordingly. Current flowing through transistors 20 and 21 of the two coupled amplifier stages, not only passes through the constant current sources 26 and 27, but also flows between the source junctions 38 and 39 from one amplifier stage to the other. Each of the two coupled amplifier stages communicates to the other differently with regard to signals versus distortion and noise. With respect to the input signal +IN, current flowing through transistor 20 of the first amplifier stage flows through coupling resistor 40 to the source of transistor 21, i.e., to the positive input junction of the second amplifier stage, resulting in amplification of the signal by the second amplifier stage, but inverted from the output −OUT of the first amplifier stage. This differentially reinforces the signal amplifying process of the first amplifier stage. By the symmetry of the two amplifier stages in the circuit, the same process will apply to the input signal −IN, so that both of the coupled stages act to amplify each other's input signal inversely, mutually reinforcing the differential signal.

With respect to distortion and noise introduced by the first amplifier stage and appearing at the output −OUT, these errors will appear also at the gate of the transistor 20 and at the source junction 38 with the same polarity and will be communicated through the coupling resistor 40 to the junction 39 so that they will be amplified positively by the second amplifier stage. Accordingly, distortion and noise at the output −OUT of the first amplifier stage will appear at the output +OUT of the second amplifier stage with the same polarity and amplitude. Again by the symmetry of the two amplifier stages, the distortion and noise due to the second amplifier stage will be applied positively to the first amplifier stage and appear on the output −OUT with the same polarity and amplitude as it appears on output +OUT. While, at first glance, this addition of distortion and noise to each other's outputs would appear to increase rather than decrease the error, this is true only when considering the performance of each stage's output alone. However, when considered differentially, it is seen that the errors appear now in common, so that common mode rejection by the load results in differential cancellation of the errors. The result is a reduction in differential distortion and noise by approximately one order of magnitude over the performance of either amplifier stage.

The amplifying process is recursive and iterative in nature, so that any error on the part of one amplifier stage in reproducing the error in the other results in additional error correction on the part of the original amplifier stage. In the absence of any coupling loss, the iterative process could go on indefinitely. If this were to occur, the small, but not insignificant, phase shift involved in the transit of the signal between the coupled amplifier stages could lead to a kind of "hall of mirrors" effect where the outputs −OUT and +OUT, when viewed non-differentially, would exhibit excessive distortion and noise, even though it might still have very good differential performance. The individual output signals would no longer resemble the input signals, especially at high frequencies, requiring a load at the receiving end having especially good common mode rejection to obtain the differential signal. Accordingly, the sources 38 and 39 of the input gain transistors 20 and 21 of the two amplifier stages are made with less than perfect coupling, using resistors 42 and 43 to provide a slight resistive loss to ground at the coupling points. Resistances of about 300Ω are typical for resistors 42 and 43 with a resistance for coupling resistor 40 of about 47Ω.

Figure 2:
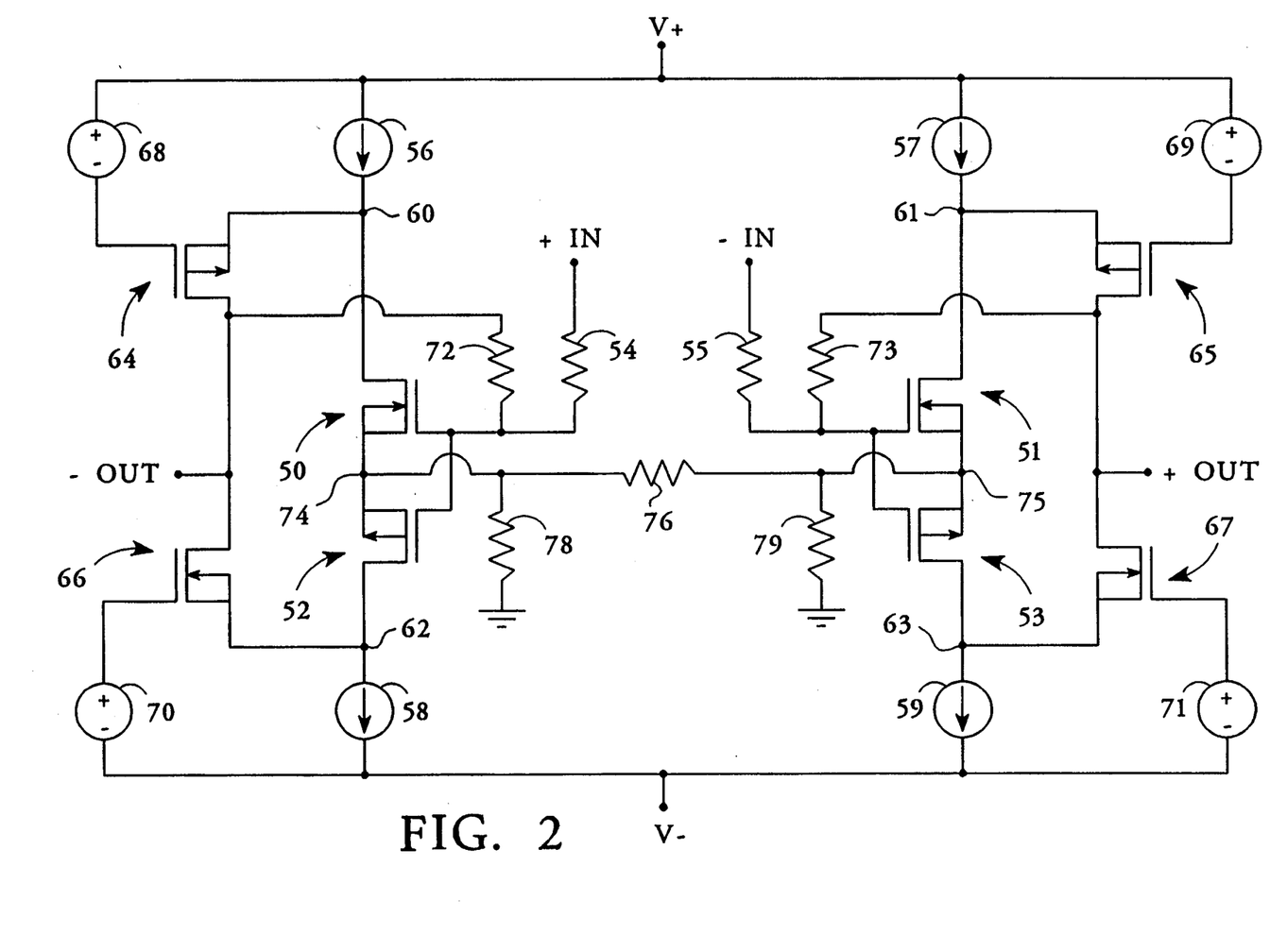
FIG. 2 is a schematic circuit diagram of a second embodiment of an amplifier of the present invention comprising a complementary-symmetry version of the amplifier of FIG. 1.

With reference to FIG. 2, a complementary-symmetry (push-pull) version of the amplifier circuit of FIG. 1 may be constructed to further reduce the distortion of the individual amplifier stages, and thus reduce the amount of error correction needed by the coupled stages. The circuit includes N-channel and P-channel field-effect transistors 50–53 which form, in push-pull pairs, input gain devices for the respective amplifier stages. Differential input signals +IN and −IN, not necessarily balanced, are applied to the gates of the transistors 50–53 through input resistors 54 and 55. The transistors 50–53 are biased by constant current sources 56–59, respectively, connecting their drain terminals to the balanced positive and negative voltage supplies V+ and V−. The drains of the gain transistors 50–53 form outputs 60–63 which connect to the sources of P-channel and N-channel field-effect transistors 64–67. In particular, the drains of the N-channel gain transistors 50 and 51 connect to the sources of the P-channel transistors 64 and 65, while the drains of the P-channel gain transistors 52 and 53 connect to the sources of the N-channel transistors 66 and 67. The transistors 64–67 form level-shifting devices in push-pull pairs, whose drain terminals form outputs −OUT and +OUT of the amplifier circuit. The level-shifting transistors 64–67 are biased in a conductive state by voltage sources 68–71 and supplied with current from the outputs of the gain transistors 50–53 by the constant current sources 56–59. The voltage drop across the current sources 56–59 determine the bias voltage needed to maintain the required gate-to-source voltage for transistor conduction. Feedback from the outputs −OUT and +OUT is brought back to the gates of the input transistors 50–53 through resistors 72 and 73, forming a loop system whose negative gain is equal to the ratios of the resistance of feedback resistors 72 and 73 to the resistance of input resistors 54 and 55. The two amplifier stages are identical, with matching resistances, transistor characteristics and biases. Further, the corresponding push and pull elements within each amplifier stage are preferably made of equal or nearly equal strength, although this particular feature of the circuit is not critical. The two amplifier stages are coupled at the common source terminals 74 and 75 of the respective push-pull pairs of input gain transistors 50 and 52, and 51 and 53, with a coupling resistor 76 connected between these source terminals 74 and 75. Resistors 78 and 79 to ground are also connected to the source terminals 74 and 75 to provide sufficient coupling loss to limit the number of error correction iterations back and forth between the two amplifier stages. These loss resistances are not critical.

Figure 3:
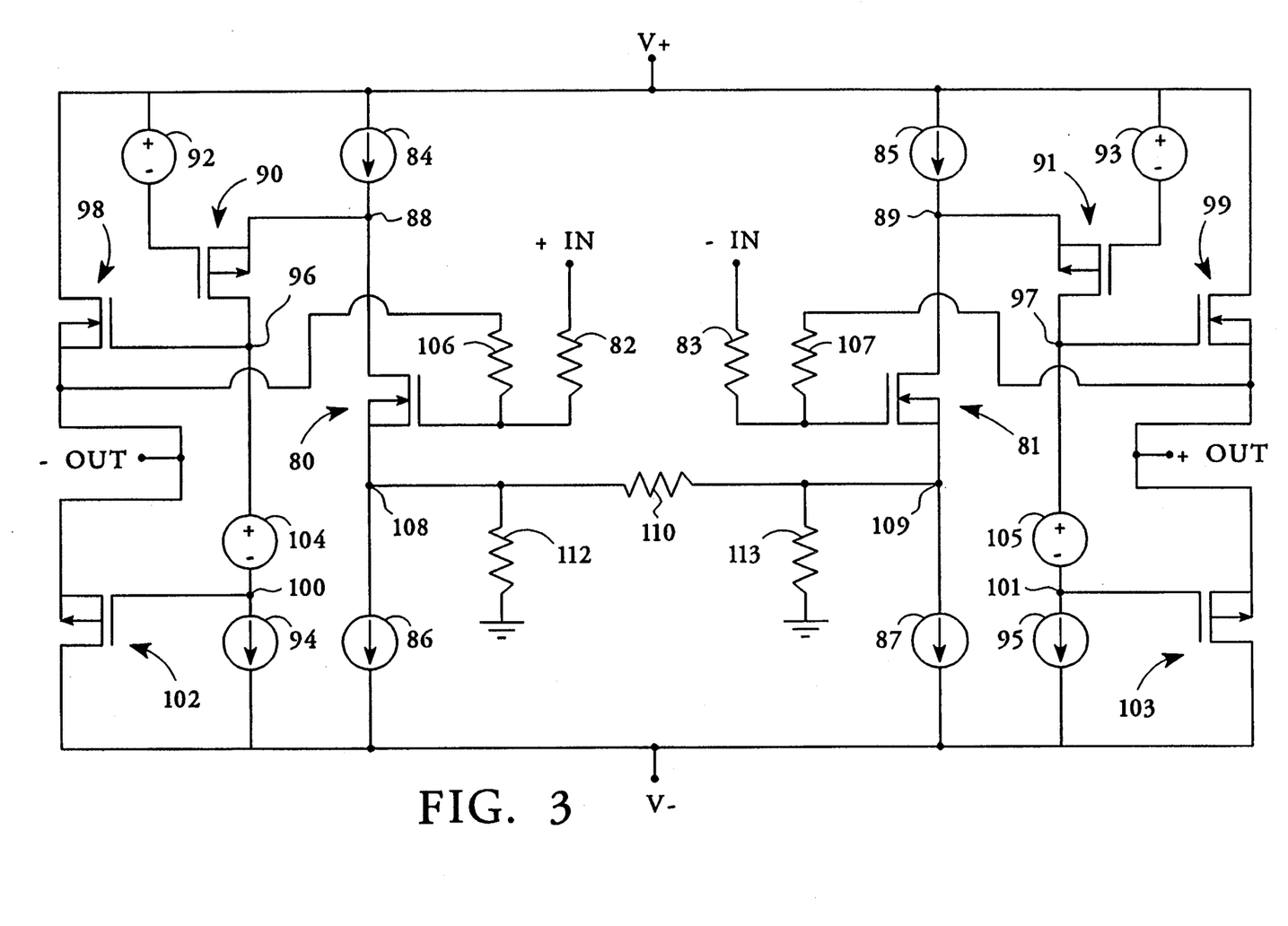
FIG. 3 is a schematic circuit diagram of a third embodiment of an amplifier of the present invention comprising a power amplifier version of the amplifier of FIG. 1 with a follower gain stage.

With reference to FIG. 3, an embodiment of the invention for use as a balanced power amplifier is shown. N-channel field-effect transistors 80 and 81 form the input gain devices for the two coupled amplifier stages. Differential input signals +IN and −IN, preferably balanced, are applied to the gates of transistors 80 and 81 through input resistors 82–83, respectively. Transistors 80 and 81 are biased by constant current sources 84–87 which connect their drain and source terminals to respective balanced positive and negative voltage supplies V+ and V−. The drains of the input gain transistors 80 and 81 form outputs 88 and 89 which connect to the source terminals of P-channel field-effect transistors 90 and 91. These transistors 90 and 91 form cascode level-shifting devices for the respective amplifier stages. Constant current sources 84 and 85 supply current to the level-shifting transistors 90 and 91 via the input transistors' outputs 88 and 89. Constant current sources 94 and 95 couple the drains of transistors 90 and 91 to the negative voltage supply V−. Voltage sources 92 and 93 apply a bias voltage to the gates of transistors 90 and 91 that is chosen to maintain the gate-to-source voltage needed to maintain transistor conduction. Together, voltage sources 92 and 93 and current sources 84, 85, 94 and 95 bias the level-shifting transistors 90 and 91. The drain terminals of the level-shifting transistors 90 and 91 couple to the gates 96 and 100, and 97 and 101, of complementary source-follower pairs of output transistors, 98 and 102 for one amplifier stage and 99 and 103 for the other amplifier stage. These output devices 98, 99, 100 and 102 are biased by voltage sources 104 and 105 into class AB or class A conduction. The common source terminals of the respective pairs of output transistors 98 and 102, and 99 and 103 form balanced outputs −OUT and +OUT for the amplifier. The effect of the output transistors is to boost the output power. Feedback is brought back from the outputs −OUT and +OUT of the two coupled output stages through resistors 106 and 107 to the gates of the input transistors 80 and 81, forming a loop system whose negative gain is equal to the ratios of the resistance of the feedback resistors 106 and 107 to the resistances of the input resistors 82 and 83. The two coupled amplifier stages are identical, with matching resistances, transistor characteristics and biases, so that the symmetry of the amplifier circuit causes the two stages to act upon one another in an identical manner. Coupling of the two stages is through a resistor 110 connecting the source terminals 108 and 109 of the respective input gain transistors 80 and 81. Resistors 112 and 113 to ground are also connected to the source terminals 108 and 109 to provide coupling loss for limiting the number of error correction iterations in the coupled system.

Figure 4:
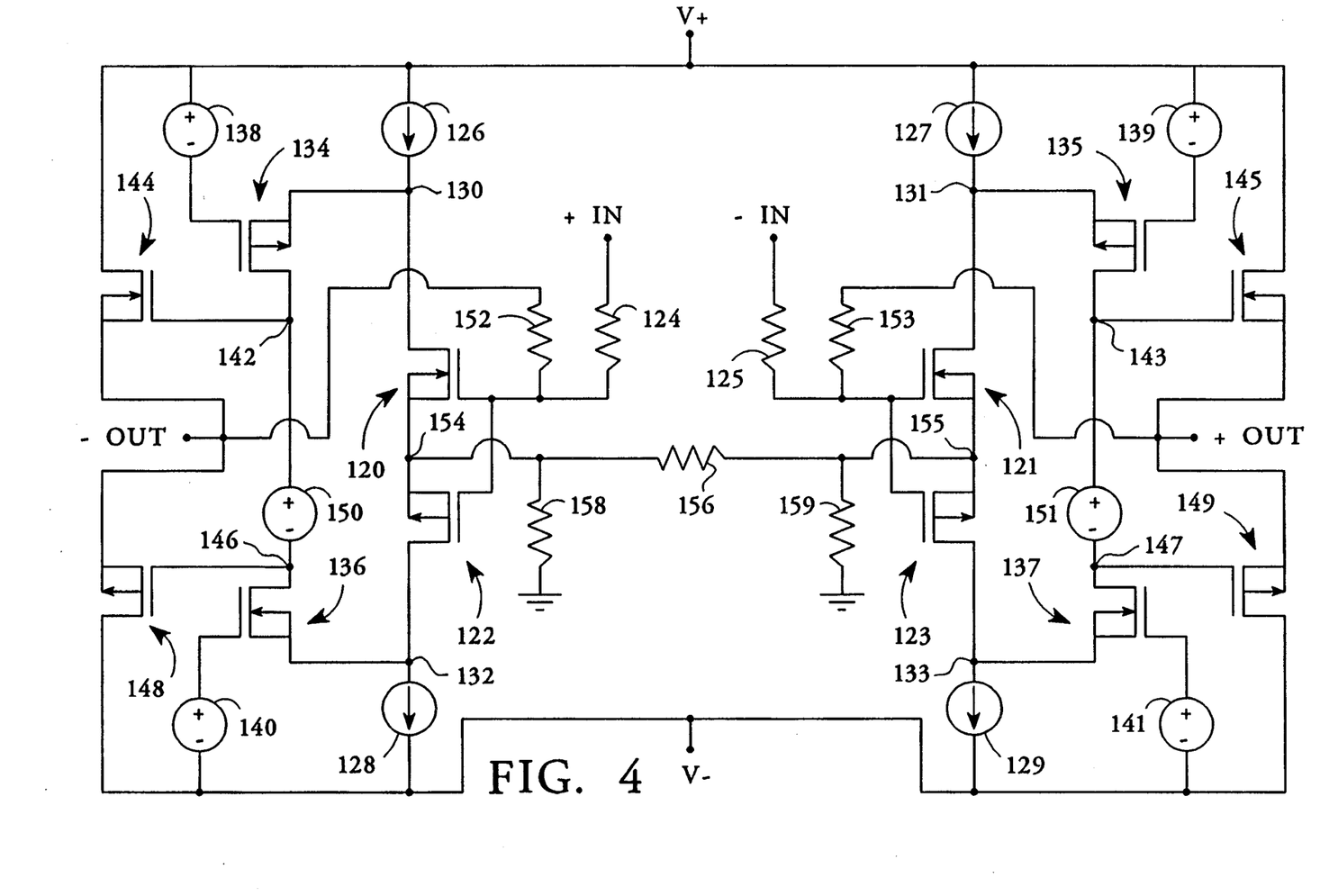
FIG. 4 is a schematic circuit diagram of a fourth embodiment of an amplifier of the present invention comprising a complementary-symmetry version of the amplifier of FIG. 3.

With reference to FIG. 4, a complementary-symmetry (push-pull) version of the power amplifier of FIG. 3 reduces the distortion of the individual amplifier stages, thereby reducing the amount of error correction needed by the coupled stages. The circuit includes N-channel and P-channel field-effect transistors 120–123 which form, in push-pull pairs, input gain devices for the respective amplifier stages. Differential input signals +IN and −IN, not necessarily balanced, are applied to the gates of the transistors 120–123 through input resistors 124 and 125. The transistors 120–123 are biased by constant current sources 126–129, respectively, connecting their drain terminals to the balanced positive and negative voltage supplies V+ and V−. The drains of the input gain transistors 120–123 form outputs 130–133 which connect to the sources of P-channel and N-channel field-effect transistors 134–137. The transistors 134–137 form level-shifting devices in push-pull pairs. In particular, the drains of the N-channel gain transistors 120 and 121 connect to the sources of the P-channel transistors 134 and 135, while the drains of the P-channel gain transistors 122 and 123 connect to the sources of the N-channel transistors 136 and 137. The level-shifting transistors 134–137 are biased in a conductive state by voltage sources 138–141 and supplied with current from the outputs of the input gain transistors 120–123 by the constant current sources 126–129. The voltage drop across the current sources 126–129 determine the bias voltage needed to maintain the required gate-to-source voltage for transistor conduction. The drain terminals 142 and 146, and 143 and 147, of the level-shifting transistor pairs 134 and 136, and 135 and 137, couple to the gates of complementary source-follower pairs of output transistors, 144 and 148 for one amplifier stage and 145 and 149 for the other amplifier stage. These output devices 144, 145, 148 and 149 are biased by voltage sources 150 and 151 into class AB or class A conduction. The common source terminals of the respective pairs of output transistors 144 and 148, and 145 and 149, form balanced outputs −OUT and +OUT for the amplifier. The effect of the output transistors is to boost the output power. Feedback is brought back from the outputs −OUT and +OUT of the two coupled output stages through resistors 152 and 153 to the gates of the input transistors 120–123, forming a loop system whose negative gain is equal to the ratios of the resistance of the feedback resistors 152 and 153 to the resistance of the input resistors 124 and 125. The two coupled amplifier stages are identical, with matching resistances, transistor characteristics and biases, so that the symmetry of the amplifier circuit causes the two stages to act upon one another in an identical manner. Coupling of the two stages is through a resistor 156 connecting the common source terminals 154 and 155 of the respective pairs of input gain transistors 120–123. Resistors 158 and 159 to ground are also connected to the source terminals 154 and 155 to provide coupling loss for limiting the number of error correction iterations in the coupled system.

Figure 9:
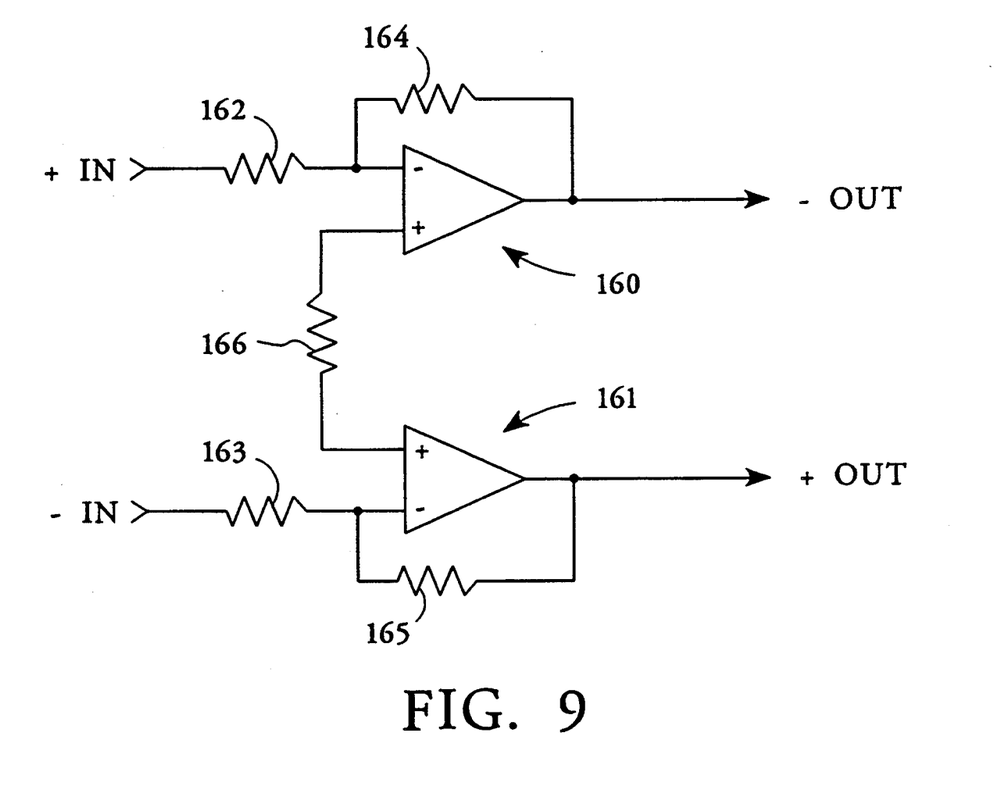
FIG. 9 is a functional circuit diagram of the amplifier of FIG. 1.

Like the functional circuit diagrams of prior amplifiers shown in FIGS. 5–8, a similar functional circuit diagram equivalent in a general way to the amplifiers of the present invention shown in FIGS. 1–4 can be constructed. This is seen in FIG. 9. Amplifiers 160 and 161 represent the two coupled amplifier stages in the circuit. Differential input signals +IN and −IN are received by the negative input terminals of the respective amplifier stages 160 and 161 via input resistors 162 and 163 and amplify them negatively to the amplifier outputs −OUT and +OUT. Feedback is brought back through resistors 164 and 165 to the negative input terminals of the same amplifier stage. The positive input terminals of the respective amplifier stages 160 and 161 are coupled together through a resistor 166. Within the amplifier stages 160 and 161, the circuitry is constructed as described previously in FIGS. 1-4 so that positive input terminals are coupled to the corresponding outputs in a way that allows the two stages to negatively feed each other the differential signal so that it is reinforced at the outputs and to positively feed each other their own distortion and noise contributions so that they are cancelled at the outputs. Thus, in one sense, the positive input terminals also form a complementary output for negative feedback of the signal to the other stage and a connection to the usable outputs −OUT and +OUT for positive feedback of the distortions and noise to the other stage. This separation of signal from distortion and noise cannot be adequately represented by the usual amplifier notation of FIG. 9 but must be seen from an examination of the internal workings of the detailed amplifier circuitry shown in FIGS. 1-4. The result is an order of magnitude reduction in distortion and noise in the differential outputs −OUT and +OUT.

I claim:

1. An amplifier circuit comprising
   a first inverting amplifier stage having a first input terminal, a first coupling terminal and a first output terminal, said first inverting amplifier stage also having a first input resistor connected to said first input terminal and a first feedback resistor connected between said first output terminal and said first input terminal,
   a second inverting amplifier stage having a second input terminal, a second coupling terminal and a second output terminal, said second inverting amplifier stage also having a second input resistor connected to said second input terminal and a second feedback resistor connected between said second output terminal and said second input terminal, said first and second inverting amplifier stages being identical, and
   means for coupling said first and second coupling terminals together, each of said first and second coupling terminals acting simultaneously as a positive input terminal of its corresponding amplifier stage, a complementary output of the corresponding amplifier stage for negative signal coupling to the other amplifier stage, and means for positively communicating distortion and noise contributions of the corresponding amplifier stage to the other amplifier stage, such that differential input signals received by said first and second input terminals are amplified and provided as balanced differential output signals on said first and second output terminals and such that distortion and noise contributions of both amplifier stages are provided in common on said first and second output terminals.

2. The amplifier circuit of claim 1 wherein each of said first and second amplifier stages is an inverting folded-cascode amplifier.

3. The amplifier circuit of claim 2 wherein said inverting folded-cascode amplifiers are complementary-symmetry (push-pull) amplifiers.

4. The amplifier circuit of claim 2 wherein said inverting folded-cascode amplifiers each include a follower output device for power amplification.

5. The amplifier circuit of claim 2 wherein said inverting folded-cascode amplifiers include field-effect transistors.

6. An amplifier circuit comprising
   a first inverting folded-cascode amplifier having a first input gain transistor with a source, a drain and a gate connected to a first input resistor, a first cascode level-shifting transistor with a source connected to the drain of said first input gain transistor, a drain coupled to a first output terminal, and a gate connected to a bias voltage selected to maintain said first cascode level-shifting transistor in a conducting state, a first feedback resistor connected between said first output terminal and said gate of said first input gain transistor, and a first constant current source connected to said drain of said first input gain transistor and said source of said first cascode level-shifting transistor, said first constant current source coupled to a first power supply, said source of said first input gain transistor and said drain of said first cascode level-shifting transistor coupled to a second power supply, said first and second power supplies being of balanced voltages,
   a second inverting folded-cascode amplifier having a second input gain transistor with a source, a drain and a gate connected to a second input resistor, a second cascode level-shifting transistor with a source connected to the drain of said second input gain transistor, a drain coupled to a second output terminal, and a gate connected to a bias voltage selected to maintain said second cascode level-shifting transistor in a conducting state, a second feedback resistor connected between said second output terminal and said gate of said second input gain transistor, and a second constant current source connected to said drain of said second input gain transistor and said source of said second cascode level-shifting transistor, said second constant current source coupled to said first power supply, said source of said second input gain transistor and said drain of said second cascode level-shifting transistor coupled to said second power supply, said second inverting folded-cascode amplifier having substantially the same operating characteristics as said first inverting folded-cascode amplifier, and
   means, connected between said sources of said first and second input gain transistors, for coupling said first inverting folded-cascode amplifier to said second inverting folded-cascode amplifier.

7. The amplifier circuit of claim 6 wherein said means for coupling includes a coupling resistor connected to said sources of said first and second input gain transistors.

8. The amplifier circuit of claim 7 wherein said means for coupling further comprises a pair of shunt resistors connected between said respective sources of said first and second input gain transistors and ground.

9. The amplifier circuit of claim 6 further comprising a first complementary (push-pull) pair of source-follower output transistors with gates biased for at least class AB conduction and coupled to said drain of said first cascode level-shifting transistor, with drains coupled to said respective first and second power supplies, and sources both connected to said first output terminal, and a second complementary (push-pull) pair of source-follower output transistors with gates biased for at least class AB conduction and coupled to said drain of said second cascode level-shifting transistor, with drains coupled to said respective first and second power supplies, and sources both connected to said second output terminal.

10. The amplifier circuit of claim 6 wherein said first and second input gain transistors are N-channel field-effect transistors and said first and second cascode level-shifting transistors are P-channel field-effect transistors.

11. The amplifier circuit of claim 6 wherein said first and second inverting folded-cascode amplifiers are complementary-symmetry amplifiers, said first inverting folded-cascode amplifier having a third input gain transistor with a source connected to the source of said first input gain transistor, a drain and a gate connected to said first input resistor, a third cascode level-shifting transistor with a source connected to said drain of said third input gain transistor, a drain coupled to said first output terminal, and a gate connected to a bias voltage selected to maintain said third cascode level-shifting transistor in a conducting state, and a third constant current source connected to said drain of said third input gain transistor and said source of said third cascode level-shifting transistor, said third constant current source also coupled to said second power supply, said second inverting folded-cascode amplifier having a fourth input gain transistor with a source connected to the source of said second input gain transistor, a drain, and a gate connected to said second input resistor, a fourth cascode level-shifting transistor with a source connected to said drain of said fourth input gain transistor, a drain coupled to said second output terminal, and a gate connected to a bias voltage selected to maintain said fourth cascode level-shifting transistor in a conducting state, and a fourth constant current source connected to said drain of said fourth input gain transistor and said source of said fourth cascode level-shifting transistor, said fourth constant current source also coupled to said second power supply.

12. The amplifier circuit of claim 11 further comprising a first complementary (push-pull) pair of source-follower output transistors with gates biased for at least class AB conduction and coupled to said drains of said respective first and third cascode level-shifting transistors, with drains coupled to said respective first and second power supplies, and with sources both connected to said first output terminal, and a second complementary (push-pull) pair of source-follower output transistors with gates biased for at least class AB conduction and coupled to said drains of said respective second and fourth cascode level-shifting transistors, with drains coupled to said respective first and second power supplies, and with sources both connected to said second output terminal.

13. The amplifier circuit of claim 6 wherein said sources of said first and second input gain transistors and said drains of said first and second cascode level-shifting transistors are respectively coupled to said second power supply via an additional four constant current sources.

* * * * *